United States Patent [19]

Pelley, III et al.

[11] Patent Number: 5,278,464
[45] Date of Patent: Jan. 11, 1994

[54] USING DELAY TO OBTAIN HIGH SPEED CURRENT DRIVER CIRCUIT

[75] Inventors: Perry H. Pelley, III; Hamed Ghassemi, both of Austin, Tex.

[73] Assignee: Motorola, Inc., Schaumburg, Ill.

[21] Appl. No.: 892,834

[22] Filed: Jun. 2, 1992

[51] Int. Cl.$^5$ ........................................... H03K 19/086
[52] U.S. Cl. ...................................... 307/455; 307/443
[58] Field of Search ............... 307/443, 455, 456, 475, 307/494, 270

[56] References Cited

U.S. PATENT DOCUMENTS

| | | | |
|---|---|---|---|
| 4,626,709 | 12/1986 | Mazumder et al. | 307/443 X |
| 4,754,171 | 6/1988 | Dasai et al. | 307/455 |
| 4,906,869 | 3/1990 | Masuoka | 307/455 |
| 4,926,065 | 5/1990 | Coy et al. | 307/475 |
| 5,006,731 | 4/1991 | Denda | 307/455 |
| 5,012,137 | 4/1991 | Muellner | 307/475 |
| 5,017,808 | 5/1991 | Ueno et al. | 307/446 |
| 5,019,726 | 5/1991 | Guo | 307/446 |
| 5,059,827 | 10/1991 | Phan et al. | 307/455 |

FOREIGN PATENT DOCUMENTS 0293022 12/1986 Japan ..................... 307/456

*Primary Examiner*—David R. Hudspeth
*Attorney, Agent, or Firm*—Maurice Jay Jones; James L. Clingan, Jr.

[57] ABSTRACT

A current driver circuit (10) sources current to an output node (N4) in response to an input signal (VI) being a logic high. The current driver circuit (10) utilizes a current source (16) which sinks current from the output node (N4) in response to the input signal (VI) switching from a logic high to a logic low. The current source (16) is deactivated for a predetermined time delay after the input signal (Vi) switches from a logic high to a logic low.

14 Claims, 1 Drawing Sheet

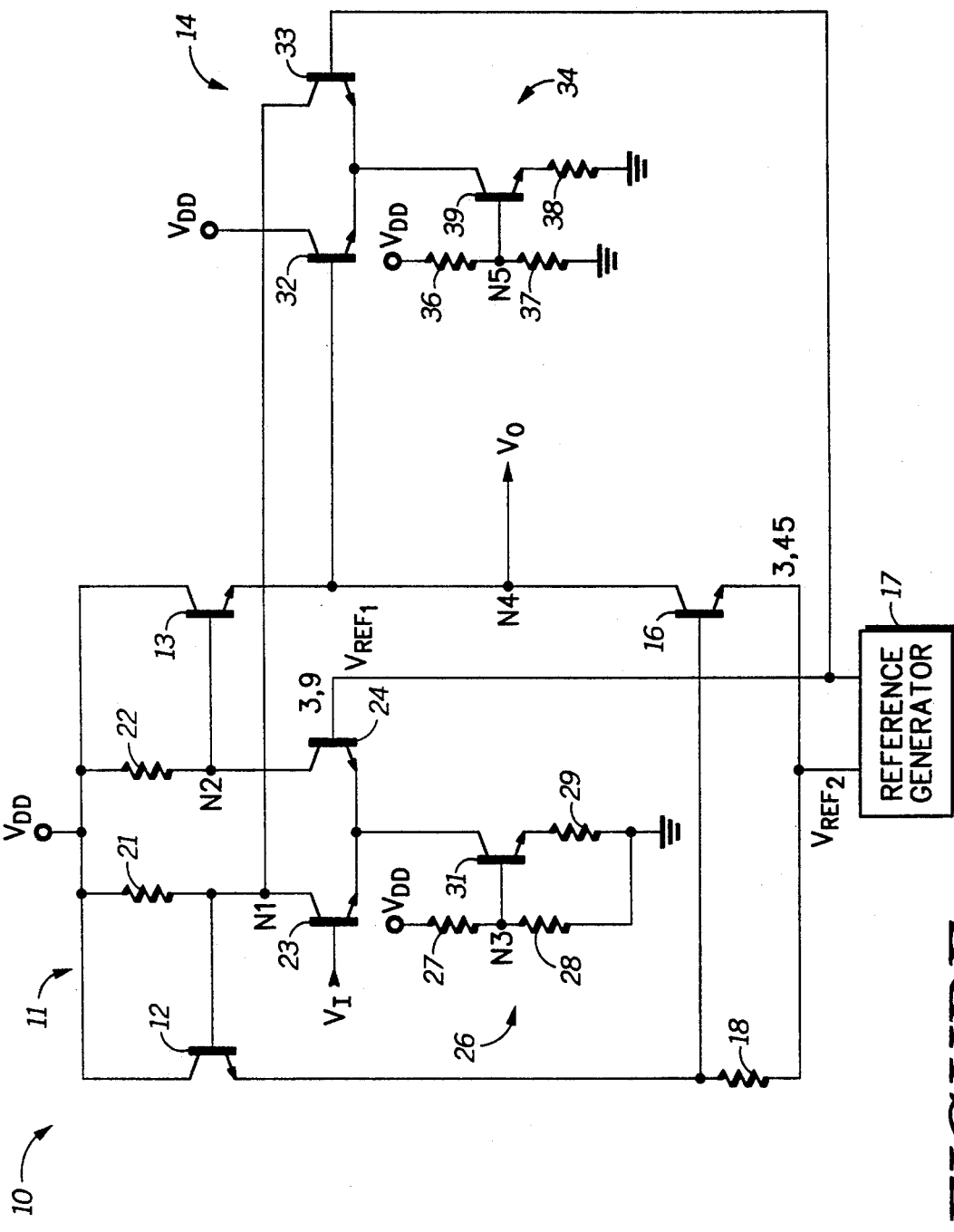
FIGURE

USING DELAY TO OBTAIN HIGH SPEED CURRENT DRIVER CIRCUIT

FIELD OF THE INVENTION

The invention relates to current drive circuits, and more particularly, to current drive circuits with high speed and low power.

BACKGROUND OF THE INVENTION

There are many circuit applications in which there is a useful signal present and the information which that particular signal represents must be provided to a significantly higher load than the signal itself can provide. This situation can arise in many different situations. The large load may be a highly capacitive line such as a bus line in a microprocessor or a large number of circuits such as decoders in a memory which must be clocked by the signal. The signal may exist at the desired voltage level but simply not have the drive capability needed. This general type of problem is addressed by a type of circuit which at least includes current amplification. These circuits are sometimes called line drivers or current drivers.

In the typical problem in which the particular current driver is present in an integrated circuit, the load typically includes high capacitance. The typical solution is to have a bipolar transistor, if one is available, to operate in an emitter-follower mode to provide the actual output to the large load. Operating in the emitter-follower mode, the bipolar transistor provides only current gain and no voltage gain. There is a reduction of the bias voltage from the base to the emitter of one base-emitter voltage drop (Vbe) which must also be taken into account. The emitter-follower is particularly effective for logic low to logic high transitions because the bipolar transistor actively provides current to the particular load. The logic high to logic low transition, however, can be a problem if the load is highly capacitive. The problem is that for the logic high to logic low transition the bipolar transistor becomes non-conductive and there is then nothing which actively reduces the voltage on the load. If the load is mostly resistive, then the logic high to logic low transition is very fast, but if it is highly capacitive, the discharge of the capacitance can be comparatively slow.

The typical solution to this problem of discharging a highly capacitive load is to provide a current source connected to the emitter of the bipolar transistor to discharge the capacitance. This has been shown to be very effective but disadvantageously increases the current required to achieve the requisite speed for the logic high logic low transition. A relatively large current for the current source improves speed for the logic high to logic low transition but not only provides the disadvantage of using more current but also provides for a decrease in speed for the logic low to logic high transition. There is thus a trade-off between improving the speed of the logic high to logic low transition while detrimentally effecting current consumption and speed of the logic low to logic high transition.

SUMMARY OF THE INVENTION

There is provided in one form of the invention a current driver circuit having a first amplifier and a second amplifier. The first amplifier provides a source of current to an output node of the current driver circuit in response to an input signal being in a first logic state. The second amplifier is coupled to the first amplifier and provides a first current sinking capability to the output node in response to the input signal switching from the first logic state to a second logic state and a second current sinking capability a predetermined time delay after this switching. The second current sinking capability is less than the first current sinking capability.

BRIEF DESCRIPTION OF THE DRAWING

The sole FIGURE is a circuit diagram of a current driver circuit according to a preferred embodiment of the invention.

DETAILED DESCRIPTION OF THE INVENTION

Shown in the sole FIGURE is a current driver circuit 10 having generally a differential amplifier 11, an NPN transistor 12, an NPN transistor 13, a differential amplifier 14, an NPN transistor 16, a reference generator 17, and a resistor 18. Differential amplifier 11 comprises a resistor 21, a resistor 22, a NPN transistor 23, an NPN transistor 24, and a constant current source 26. Constant current source 26 comprises a resistor 27, a resistor 28, a resistor 29, and an NPN transistor 31. Differential amplifier 14 comprises an NPN transistor 32, and NPN transistor 33, and a current source 34. Current source 34 comprises a resistor 36, a resistor 37, a resistor 38, and a transistor 39.

Current driver circuit 10 is coupled between a positive power supply terminal VDD and a negative power supply terminal which is shown as ground in the figure. Resistor 21 has a first terminal connected to VDD, and a second terminal connected to a node N1 which is a complementary output of differential amplifier 11. Resistor 22 has a first terminal connected VDD, and a second terminal connected to node N2 which is a true output of differential amplifier 11. Transistor 23 has a collector connected to node N1, a base for receiving an input signal VI, and an emitter connected to current source 26. Transistor 24 has a collector connected to node N2, and a base connected to reference generator for a receiving a reference voltage Vref1, and an emitter connected to current source 26. Resistor 27 has a first terminal connected to VDD, and a second terminal connected to a node N3. Resistor 28 has a first terminal connected to ground, and a second terminal connected to node N3. Transistor 31 has a collector connected to the emitters of transistors 23 and 24, a base connected to node N3, and an emitter. Resistor 29 has a first terminal connected to ground, and a second terminal connected to the emitter of transistor 31. Transistor 13 has a collector connected to VDD, a base connected to node N2, and an emitter connected to node N4 which is an output labeled "VO" of current driver 10. Transistor 32 has a collector connected to VDD, a base connected to node N4 and is an input of amplifier 14, and an emitter connected to current source 34. Transistor 33 has a collector connected to node N1 as an output of amplifier 14, a base connected to reference voltage generator 17 for receiving reference voltage Vref1, and an emitter connected to current source 34. Resistor 36 has a first terminal connected to VDD, and a second terminal connected to a node N5. Resistor 37 has a first terminal connected to ground and a second terminal connected to node N5. Transistor 39 has a collector connected to the emitters of transistors 32 and 33, a base connected to node N5, and an emitter. Resistor 38 has a first terminal connected to ground, and a second terminal connected to the emitter of transistor 39. Transistor 12 has a collector connected to VDD, a base connected to node N1, and an emitter. Transistor 16 has a collector connected to node N4, a base connected to the emitter of transistor 12, and an emitter connected to reference generator 17 for receiving a reference voltage Vref2. Resistor 18 has a first terminal connected to the base of transistor 16, and a second terminal connected to reference voltage generator 17 for receiving Vref2.

Operationally differential amplifier 11 operates to provide an amplified output of signal VI on node N2. Current source 26 provides a constant current between the emitters of transistors 23 and 24 and ground. Reference voltage Vref1 is chosen to be approximately half way between the logic high and the logic low of signal VI. For the nominal case in which VDD is 5 volts, input signal VI switches between a 3.75 volts and 4.05 volts so that Vref1 is chosen to be 3.9 volts. This voltage swing for signal VI is a typical voltage swing for emitter-coupled-logic (ECL) levels. For the case in which signal VI is a logic high of 4.05 volts, transistor 24 will become non-conductive. With transistor 24 non-conductive, transistor 13 will be driven by the voltage at VDD through resistor 22. The voltage on the base of transistor 13 will thus rise to be very near the voltage at VDD which is nominally 5 volts. Transistor 13 thus provides output signal VO at about one base-emitter drop (Vbe) below VDD. A Vbe is about 0.7 volt so output signal VO is about 4.3 volts. This portion of the operation is conventional.

Signal VO at a voltage of VDD-Vbe causes transistor 32 to be conductive so that the emitters of transistors 32 and 33 are at a voltage of about 3.6 volts. With the base of transistor 33 at 3.9 volts, transistor 33 is non-conductive. Accordingly, the output of amplifier 14, the collector of transistor 33, does not draw current from node N1. Thus, in response to the output of differential amplifier 11 providing a logic high on node N2, which is coupled to the input of amplifier 14 via transistor 13, amplifier 14 provides a high impedance to the base of transistor 12. A high impedance output can be considered a logic high output.

The input signal VI at a logic high, which causes a logic high output on the true output of amplifier 11, also causes a logic low at the complementary output of amplifier 11 which is connected to node N1. The complementary output of amplifier 11 is the connection between the collector of transistor 23 and resistor 21. The complementary output of amplifier 11 is thus connected to the base of transistor 12 as is the output of amplifier 14. The emitter of transistor 12 can be no lower than 3.45 volts due to resistor 18 being connected to Vref2. The complementary output of amplifier 11 with VI at a logic high is of sufficiently low voltage to ensure that transistor 16 is non-conductive. This is achieved by causing the voltage drop across resistor 21 to be sufficiently great to have less than two Vbe's between node N1 and the voltage at Vref2 of 3.45 volts. A minimum Vbe is considered to be 0.6 volt. Thus, for transistor 16 to be ensured of being non-conductive, the voltage on node N1 must be less than 1.2 volts above Vref2, which is 4.65 volts. Thus, the current drawn through transistor 23 must be sufficient to drop more than 0.35 volt across resistor 21. This current is set by current source 26. Thus, for the logic high output situation, transistor 13 provides an output of VDD-Vbe and transistor 16 is non-conductive.

Input signal VI switching to a logic low causes transistor 23 to immediately become non-conductive or very nearly so. The base of transistor 24 at 3.9 volts keeps the emitters of transistors 23 and 24 from dropping below about 3.2 volts. Thus, a logic low input of 3.75 volts will cause transistor 23 to a have a forward bias between its base and emitter of only 0.55 volts causing it to be essentially non-conductive. With transistor 23 non-conductive, the complementary output of amplifier 11 will immediately approach the voltage at VDD. This will cause transistor 12 to increase the voltage on the base of transistor 16 until transistor 16 becomes conductive. Transistor 16 becoming conductive will draw current from node N4, the output of current driver 10. When transistor 16 becomes conductive, transistor 13 will be non-conductive because the true output at node N2 of amplifier 11 will be a logic low of about 4.4 volts. The true output of amplifier 11 is brought to a logic low by transistor 24 becoming conductive. As transistor 23 becomes non-conductive in response to input signal VI being a logic low, the voltage on the emitters of transistors 23 and 24 drops until transistor 24 becomes conductive. The voltage drop across resistor 22 is determined by the current therethrough which current is set by current source 26. The current provided by current source 26 is set by voltage division of resistors 27 and 28 and the consequent current established through resistor 29. Over process variations the resistances of resistors 22 and 29 will change by the same percentages so that the voltage drop across resistor 22 will change very little. With the base of transistor 13 at 4.4 volts, transistor 13 will remain non-conductive until signal VO drops to about 3.8 volts. Thus, transistor 16 is not required to sink current provided by transistor 13 when transistor 16 begins to draw current. Thus, transistor 16 can quickly discharge capacitance connected to node N4 to quickly reduce the voltage of signal VO to be recognizable as a logic low. Amplifier 14 and transistor 12 are used to cause transistor 16 to become non-conductive after performing its desired function of quickly discharging the capacitance connected to the output of current driver 10. Transistor 13 prevents node N4 from becoming a voltage any lower than about 3.8 volts.

Amplifier 14 responds to the logic low output of amplifier 11 via transistor 13 and 16 by providing a logic low output on the collector of transistor 33. This is achieved by transistor 32 responding to the logic low of output signal VO dropping in voltage. The base of transistor 33 is at the voltage of Vref1 of 3.9 volts so that the emitters of transistors 32 and 33 will be no lower than a Vbe below 3.9 volts. Thus, transistor 32 will be non-conductive as signal VO drops below 3.9 volts. Thus, the output of amplifier 14 will not be providing a logic low output until the output of amplifier 14 drops significantly below its logic high state. The response of amplifier 14 to provide a logic low to transistor 12 is thus delayed from the time that transistor 16 operates to draw current. When amplifier 14 does provide the logic low to transistor 12, transistor 16 becomes non-conductive or at least substantially reduced in conductivity. Transistor 16 becoming non-conductive is a result of node N1 being reduced to below 3.65 volts. With node N1, the base of transistor 12 below 4.65 volts, there is less than two Vbe's difference between the base of transistor 12 and the emitter of transistor 16. In such case transistor 12 can be conductive because resistor 18 can sink current from transistor 12. This assures that there is at least a Vbe drop from the base of transistor 12 to the emitter of transistor 12. Thus, there is then less than one Vbe from the base of transistor 16 to the emitter of transistor 16. Resistor 18 causes transistor 16 to become non-conductive more quickly because resistor 18 can sink current from capacitance on the base of transistor 16. Transistor 12 thus operates to enable transistor 16 in response to amplifier 11 providing a logic low output on its true output and a logic high on its complementary output and subsequently disabling transistor 16 a predetermined time later. The collector dotting of the collectors of transistors 23 and 33 at node N1 operates similar to an AND gate because if either amplifier 14 or the complementary output of amplifier 11 provide a logic low, then transistor 12 provides a logic low output on the emitter of transistor 12. An output of transistor 12 which is less than one Vbe above Vref2 is effective as a logic low. With the inverting nature of transistor 16 as it is connected in driver 10, transistors 12 and 16 combine to operate similar to a NAND gate. Transistor 16 is enabled to initiate a logic low in response to both amplifier 14 or the complementary output of amplifier 11 providing a logic low output. Transistor 12 is useful in providing desirable biasing levels and current gain.

For the case in which output signal VO is a logic low and input signal VI switches from a logic low to a logic high, transistor 23 becomes conductive while transistor 33 is already conductive. There is thus current being drawn through resistor 21 from both transistor 23 and transistor 33. Signal VI at a logic high is no more than 4.05 volts, thus, for transistor 23 to avoid saturation, node N1 must only be greater than 4.05 volts. This can be achieved and still control transistor 16 as desired. To ensure that transistor 16 is non-conductive, the base of transistor must be less than 0.6 volt above 3.45 volts which is 4.05 volts. For transistor 12 to be conductive, there must be at least a 0.6 volt difference between node N1 and the emitter of transistor 12. Thus, if node N1 is 4.65 volts or lower, transistor 16 is ensured of being non-conductive. Thus, there should be at least a 0.35 volt drop across resistor 21 to ensure that transistor 16 is non-conductive. This is achieved by setting the current through current sources 26 and 34 properly. For margin to ensure that transistor 16 is non-conductive for all variables including temperature and process variations, it may be desirable for current through current sources 26 and 31 to be set to provide 0.5 volt, 0.6 volt, or greater voltage drop across resistor 21. For example, when both transistor 33 and transistor 23 are conductive, there could be as much as 1.2 volts of drop across resistor 21 and establish a voltage of 3.8 volts on node N1. This would place transistor 23 in saturation. Transistor 23 would not remain in saturation long though because transistor 33 will become non-conductive in response to input signal VI switching to a logic high. After transistor 33 becomes non-conductive, only transistor 23, except for a small current into the base of transistor 12, is drawing current through resistor 21. The voltage drop across resistor 21 will thus be reduced. Thus, node N1 will rise in voltage resulting in transistor 23 no longer being in saturation.

If transistor 23 being in saturation is deemed to be a problem, a PN junction diode can be connected between VDD and node N1. One way this could be done is for the base and collector of an NPN transistor to be connected to VDD and the emitter thereof connected to node N1. This would ensure that the voltage on node N1 would be no lower than one Vbe below VDD, thereby ensuring that transistor 23 would not be in saturation even when input signal VI switches from a logic low to a logic high of 4.05 volts and transistors 23 and 33 sink current which would cause a voltage drop greater than 0.95 volt if drawn through resistor 21. Also, the PN junction diode can be used to adjust the logic low level margin at the base of transistor 16. Another way to prevent transistor 23 from reaching saturation would be for the voltage drop across resistor 21 to be less than that required to reach saturation for transistor 23. This would perhaps result in transistor 16 having its conductivity merely reduced instead of essentially stopped in response to amplifier 14 providing a logic low to transistor 12. Thus in the case in which input signal VI switches to a logic low and transistor 16 becomes highly conductive to discharge the capacitance on node N4, transistor 16 would then, after the delay provided by amplifier 14, have its conductivity reduced but still draw a very small current (typically in the 0–10 microamp range) from transistor 13. There may be situations in which some small conductivity of transistor 16 is desirable in a steady state logic low condition.

The present example was explained with VDD at 5 volts which is the typical industry standard. The reference voltages Vref1 and Vref2 were given as examples assuming VDD was at 5 volts. Both Vref1 and Vref2 should be referenced with respect to the voltage at VDD in that they should rise and fall the same as the voltage at VDD rises and falls. This can be achieved with reference voltage generators, such as bandgap reference generators, well known in the art.

While the invention has been described in a specific embodiment, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

We claim:

1. A current driver circuit comprising:
   a first amplifier having a first input, a true output, and a complementary output;
   a first transistor having a base coupled to the true output of said first amplifier, a collector coupled to a first power supply terminal, and an emitter for providing an output signal of the current driver circuit;
   a delay circuit having an input coupled to the true output of the first amplifier, and an output;
   a controllable current source connected to the emitter of the first transistor; and
   logic means, coupled to the controllable current source, for controlling the controllable current source in response to the complementary output of the amplifier and the output of the delay circuit, wherein the logic means comprises a second transistor having a base coupled to the complementary output of the amplifier and the output of the delay circuit, a collector coupled to the first power supply terminal, and an emitter coupled to the controllable current source.

2. The current driver circuit of claim 1 wherein the controllable current source comprises a third transistor having a base coupled to the emitter of the second transistor, a collector coupled to the emitter of the first transistor, and an emitter coupled to a second power supply terminal.

3. The current driver circuit of claim 2 further comprising a reference voltage generator for providing a first reference voltage on the second power supply terminal.

4. The current driver circuit of claim 3 wherein the reference voltage is referenced with respect to a voltage present on the first power supply terminal.

5. The current driver circuit of claim 4 wherein the delay circuit is an amplifier coupled to the output of the true output of the first amplifier via the first transistor.

6. The current driver circuit of claim 5 wherein the first amplifier is a differential amplifier having a second input for receiving a second reference voltage.

7. The current driver circuit of claim 6 wherein the first amplifier comprises fourth and fifth transistors having emitters coupled together, a first constant current source coupled to the emitters of the fourth and fifth transistors, first resistor connected to the fourth transistor to provide the complementary output at the connection thereof, and a second resistor connected to the fifth transistor to provide the true output at the connection thereof.

8. A current driver circuit comprising:
   a first amplifier for providing a source of current to an output node of the current driver circuit in response to an input signal being in a first logic state; and
   a second amplifier, coupled to the first amplifier, for providing a first current sinking capability to the output node in response to the input signal switching from the first logic state to a second logic state and a second current sinking capability a predetermined time delay after said switching, said second current sinking capability being less than said first current sinking capability, wherein the second amplifier comprises:
      a delay circuit coupled to the first amplifier for providing a delay signal a predetermined time delay after the input signal switches from the first logic state to the second logic state; and
      a third amplifier coupled to the first amplifier and the delay circuit for sinking current from the output node in response to the input signal switching from the first logic state to the second logic state.

9. The current driver circuit of claim 8 wherein the first amplifier is characterized as providing a first signal and a second signal in response to the input signal, said providing a source of current being in response to the first signal.

10. The current driver circuit of claim 9 wherein the delay circuit is further characterized as providing the delay signal in response to the first signal of the first amplifier.

11. The current driver circuit of claim 10 where in the third amplifier is further characterized as sinking current in response to the second signal of the first amplifier.

12. The current driver circuit of claim 11 wherein the delay circuit is further characterized as altering the second signal in response to providing the delay signal.

13. The current driver circuit of claim 12 wherein the third amplifier comprises:
   a first transistor having a base for receiving the second signal, a collector coupled to a first power supply terminal, and an emitter;
   a second transistor having a base coupled to the emitter of the first transistor, a collector coupled to the output node, and an emitter coupled to a second power supply terminal.

14. A method for providing current drive to an output node, comprising the steps of:
   sourcing current to the output node in response to an input signal being in a first logic state;
   sinking current from the output node in response to the input signal switching from the first logic state to a second logic state;
   generating a delay signal a predetermined time period after the input signal has switched from the first logic state to the second logic state;
   substantially reducing the sinking of current from the output node in response to the delay signal;
   amplifying the input signal;
   generating a true output signal and a complementary output signal representative of the input signal; and
   switching the complementary signal to the second logic state in response to the delay signal; and
   further characterized as:
      the sourcing of current being in response to the true output signal being in the first logic state; and
      the sinking of current being in response to the complementary signal being in the first logic state.

* * * * *